(12) United States Patent  
Kusunoki

(10) Patent No.: US 6,466,092 B2  
(45) Date of Patent: Oct. 15, 2002

(54) DISTORTION COMPENSATION METHOD AND APPARATUS

(75) Inventor: Shigeo Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/882,224

(22) Filed: Jun. 15, 2001

(65) Prior Publication Data

US 2002/0010567 A1 Jan. 24, 2002

(30) Foreign Application Priority Data

Jun. 16, 2000 (JP) ........................................ 2000-182274

(51) Int. Cl.[7] ................................................. H03F 1/26
(52) U.S. Cl. ....................... 330/149; 330/136; 375/297
(58) Field of Search ................................ 330/136, 149, 330/289, 298; 375/297

(56) References Cited

U.S. PATENT DOCUMENTS

| | | | | |
|---|---|---|---|---|
| 4,210,874 A | * | 7/1980 | Moskowitz | 330/134 |
| 4,389,618 A | * | 6/1983 | Bauman | 330/149 |
| 4,591,800 A | * | 5/1986 | Opas | 330/86 |
| 5,105,164 A | * | 4/1992 | Fisher et al. | 330/149 |
| 5,124,665 A | * | 6/1992 | McGann | 330/149 |

* cited by examiner

Primary Examiner—Robert Pascal  
Assistant Examiner—Henry Choe  
(74) Attorney, Agent, or Firm—Jay H. Maioli

(57) ABSTRACT

A distortion compensation method and apparatus for compensating distortion components of a device, such as a power amplifier, wherein should distortion persist in an output of the power amplifier 23, only distortion components are represented on subtracted results S40. These subtracted results S40 are summed to data written in a random access memory 17 with a signal S3 as an address, and are again written in a second memory 17. The data in the random access memory 17 provide an address for a next following third memory 19 to help output data S44 stored in the third memory 19. These data S44 in the third memory are summed by an adder 7 provided in an amplitude distortion correction channel to amplitude correct data in the first memory 6. The resulting sum data is input to the power amplifier 23 desired to be compensated to contribute to correction of the amplitude distortion.

16 Claims, 12 Drawing Sheets

DISTORTION COMPENSATION METHOD AND APPARATUS

BACKGROUND OF THE INVENTION

1. Field of the Invention

This invention relates to a distortion compensation apparatus. More particularly, it relates to a method and apparatus applicable to a high frequency power amplifier for transmission usable in particular in a portable telephone set.

2. Description of Related Art

In keeping up with increasing speed and increasing capacity in communication, the demand for linearity in a transmission power amplifier in a digital radio communication equipment is becoming more and more strict. This, however, obstructs improvement in the power efficiency in the power amplifier.

On the other hand, the continuous call time of a digital portable telephone set now in widespread use in general is becoming longer. Thus, in offering a new digital radio communication equipment to the market, its using time cannot be discounted in view of the competition power proper to a product. With this in view, the trend towards introducing the technique of distortion compensation for improving the efficiency is becoming brisk.

However, this technique is in need of a voluminous circuit scale and is extremely difficult to realize in a portable telephone set which features small size and lightness in weight. Moreover, because of the properties of the portable terminal, the environment in which the set is used id changed significantly, such that it is imperative to realize this distortion compensation by adaptive distortion compensation in order to follow up with these changes in environment. This poses a serious problem in conjunction with the demand for reduction in size. As a device for distortion compensation, there is known a technique of pre-distortion employing compensation means having opposite characteristics to those of the distortion of the power amplifier.

As this technique of pre-distortion, there are several reports as to adaptations of pre-distortion and adaptations of feedforward techniques. Several conventional techniques in the field of the adaptive secondary cell device used for the pre-distortion are hereinafter explained.

As a first conventional stricture, FIG. 1 shows a block diagram of a technique introduced e.g., in 1992. European Microwave Conference Vol. 22, pp. 1125 to pp. 1130, "Power Amplifier Adaptive Linearization Using Predistortion with Polynominal".

Referring to FIG. 1, if non-linear input/output characteristics of a power amplifier (PA) 114, the distortion of which is to be compensated, are given by Vout=A(Vin), in-phase and quadrature signals I, Q of the input baseband to be input at an input terminal 111 may be calculated by a linearization comparator circuit 112 using a function H(I, Q) which linearizes A(Vin). The resulting I, Q signals are fed to a digital to analog converter (DAC) 113 and thereby analogized, while being converted into high frequency band signals which are input to a power amplifier 114. An output Vout of the power amplifier 114 is detected and output from an output terminal 115, at the same time as it is converted in a demodulator circuit 116 into baseband signals If and Qf. As for adaptive compensation for coping with changes in temperature, the linearization comparator circuit 112 compares the input signals I, Q to detection signals If, Qf to adjust a constant in a linearization function H so that a difference therebetween will be equal to zero. This operation is repeated until the difference is correctly equal to zero to set the constant in the function H (I, Q) ultimately to a proper value.

As another conventional structure, there is, for example, a technique disclosed in IEEE Transaction on Vehicular Technologies, Vol. 43, No. 2, May 1994, pp. 323 to pp. 332, "Adaptive Linearization Using Predistortion". FIG. 2 herein shows a block diagram disclosed in this publication. In FIG. 2, those parts or components corresponding to those shown in FIG. 1 are denoted by the same reference numerals. A conversion table 124, such as a memory, is accessed for the input signals I and Q to effect data conversion to derive data I', Q' capable of linearizing the power amplifier 114. These data I', Q' are input to the power amplifier 114. An output Vout of the power amplifier 114 is detected and converted in a demodulator 116 to produce signals If, Qf. For adaptive compensation, there is provided an address generator 123 for comparing the input signals I, Q to detection signals If, Qf from the demodulator 116 to adjust the address for accessing the conversion table 124 so that a difference en will be zero. The address generator 123 is repeatedly adjusted until the difference en is correctly zero to optimize the address value which accesses the conversion table 124.

In the above-described conventional structures, the constant included in the linearization function or the address for accessing the linearization table is optimized. However, in these structures, repetitive operations are carried out using a feedback loop to reduce the difference. However, the feedback loop suffers a serious problem that the loop contains characteristics of the power amplifier 114 such that there is no guarantee that the convergence to an optimum value in stability will be realized at all times.

Moreover, the above-described conventional structures are in need of a demodulator in order to effect conversion of the power amplifier output into the baseband output. Since this demodulator is in general a quadrature demodulator, the circuit scale is voluminous.

SUMMARY OF THE INVENTION

It is therefore an object of the present invention to provide a method and apparatus for distortion compensation whereby the distortion component of a device such as a power amplifier can be compensated extremely readily.

It is another object of the present invention to provide a method and apparatus which is not in need of the demodulator to simplify the structure.

In one aspect, the present invention provides a distortion compensation apparatus for compensating distortion components generated in a device, including adaptive amplitude distortion compensation means for finding an amplitude difference between an envelope signal of an input signal supplied to the device and an envelope signal of an output signal of the device, outputting adaptive correction data of amplitude distortion against temperature fluctuations in the device based on cumulative results of integration of the amplitude difference and for adaptively compensating the amplitude distortion of the device using the adaptive correction data.

Preferably, the distortion compensation apparatus includes amplitude distortion correcting means for outputting correction data for correcting the amplitude distortion of the device based on the envelope signal of the input signal supplied to the device, and for controlling the gain changing processing of the device responsive to the correction data to correct the amplitude distortion of the device.

Preferably, the adaptive amplitude distortion compensation means sums the adaptive correction data to the correction data used in the amplitude distortion correcting means to effect adaptive compensation of the amplitude distortion of the device.

Preferably, the adaptive amplitude distortion compensation means includes first envelope detection means for detecting an envelope signal of an input signal supplied to the device, second envelope detection means for detecting the envelope component of an output signal of the device, subtraction means for finding an amplitude difference between the envelope component of the input signal as detected by the first envelope detection means and the envelope component of the output signal as detected by the second envelope detection means, cumulating means for integrating and cumulating the amplitude difference as obtained by the subtraction means and adaptive correction data outputting means for outputting adaptive correction data against temperature fluctuations in the device based on the cumulated results in the cumulating means.

Preferably, the distortion compensation apparatus includes adaptive phase distortion compensation means for outputting adaptive phase distortion correction data against temperature fluctuations of the device based on a phase different between an input signal supplied to the device and an output signal from the device and for adaptively compensating the phase distortion of the device using the adaptive correction data.

Preferably, the distortion compensation apparatus further includes phase distortion correction means for outputting correction data for correcting the phase distortion of the device based on an envelope signal of an input signal supplied to the device and for controlling the phase shifting processing of the device responsive to the correction data to correct the phase distortion of the device.

Preferably, the adaptive phase distortion compensation means sums the adaptive correction data to the correction data used in the phase distortion correcting means to adaptively compensate the phase distortion of the device.

Preferably, the adaptive phase distortion compensation means includes phase different detection means for detecting the phase different between an input signal supplied to the device and an output signal from the device and adaptive phase distortion correcting data outputting means for outputting adaptive phase distortion correction data against temperature fluctuations of the device based on the phase difference as detected by the phase different detection means.

In another aspect, the present invention provides a distortion compensation method for compensating distortion components generated in a device, including an adaptive amplitude distortion compensation step for finding an amplitude difference between an envelope signal of an input signal supplied to the device and an envelope signal of an output signal of the device, outputting adaptive correction data of amplitude distortion against temperature fluctuations in the device based on cumulative results of integration of the amplitude difference and for adaptively compensating the amplitude distortion of the device using the adaptive correction data.

Preferably, the distortion compensation method further includes an amplitude distortion correcting step for outputting correction data for correcting the amplitude distortion of the device based on the envelope signal of the input signal supplied to the device, and for controlling the gain changing processing of the device responsive to the correction data to correct the amplitude distortion of the device.

Preferably, the adaptive amplitude distortion compensation step sums the adaptive correction data to the correction data used in the amplitude distortion correcting step to effect adaptive compensation of the amplitude distortion of the device.

Preferably, the distortion compensation method further includes an adaptive phase distortion compensation step for outputting adaptive phase distortion correction data against temperature fluctuations of the device based on a phase different between an input signal supplied to the device and an output signal from the device and for adaptively compensating the phase distortion of the device using the adaptive correction data.

Preferably, the distortion compensation method further includes a phase distortion correction step for outputting correction data for correcting the phase distortion of the device based on an envelope signal of an input signal supplied to the device and for controlling the phase shifting processing of the device responsive to the correction data to correct the phase distortion of the device.

Preferably, the adaptive phase distortion compensation step sums the adaptive correction data to the correction data used in the phase distortion correcting step to adaptively compensates the phase distortion of the device.

According to the present invention, distortion components in the power amplifier can be compensated extremely readily using a method comprised of envelope detection without resorting to quadrature demodulation. Moreover, since the distortion component is detected by integration of an output input difference to effect distortion compensation, even the slightest distortion compensation can be detected.

DESCRIPTION OF THE PREFERRED EMBODIMENTS

Figure 1:
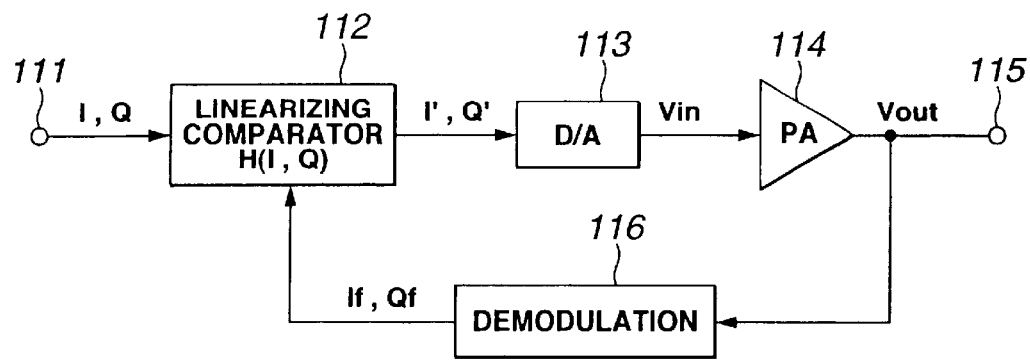
FIG. 1 is a block diagram showing a first conventional technique.
Figure 2:
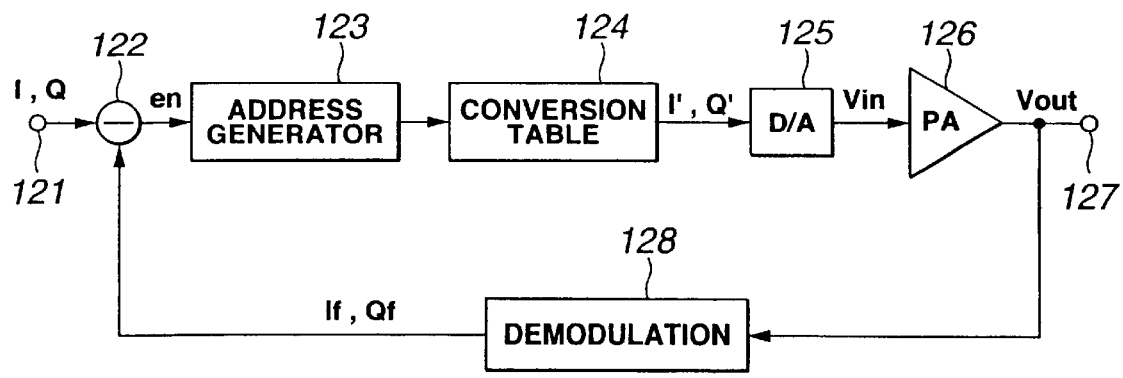
FIG. 2 is a block diagram showing a second conventional technique.

Referring to the drawings, preferred embodiments of a distortion compensation apparatus according to the present invention will be explained in detail. This distortion compensation apparatus is designed to compensate the distortion in a high frequency power amplifier in a digital radio communication apparatus, abbreviated herein to power amplifier.

Figure 3:
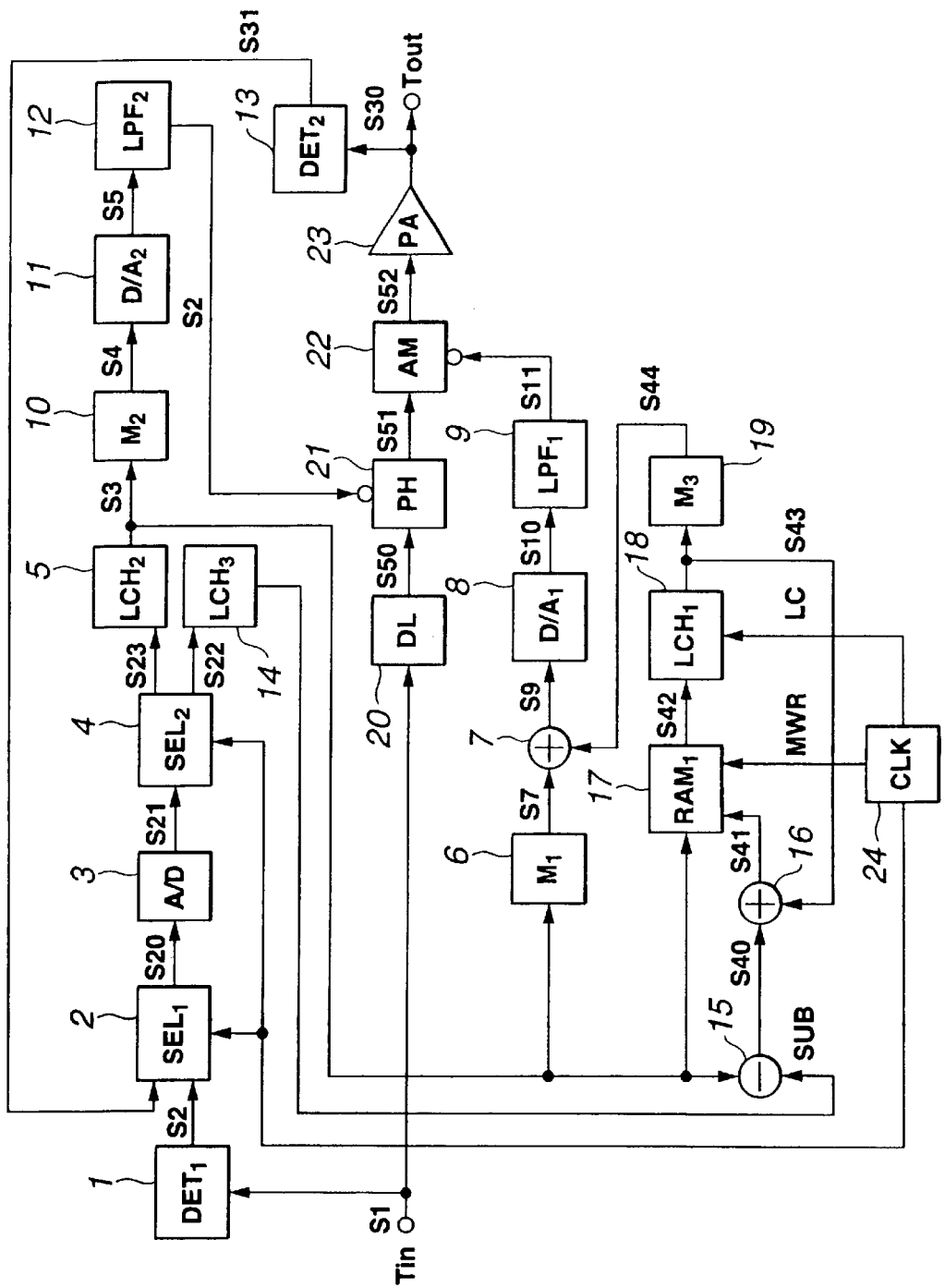
FIG. 3 is a block diagram showing an overall structure of a distortion compensation apparatus embodying the present invention.

Referring to FIG. 3, an overall structure of a distortion compensation apparatus is explained. This distortion compensation apparatus is mainly constituted by four channels, namely an amplitude distortion correcting channel, as a channel for correcting the amplitude distortion of the power amplifier, a phase distortion correcting channel, as a channel for correcting the phase distortion of the power amplifier, a channel for adaptive compensation of the amplitude distortion accompanying variations in the power amplifier temperature and a channel traversed by high frequency signals reaching the power amplifier.

The amplitude distortion correcting channel is the amplitude distortion correcting means for outputting correction data for correcting the amplitude distortion of the power amplifier based on envelope signals of high frequency input signals supplied to the power amplifier to control the gain changing processing of the power amplifier responsive to the correction data to correct the amplitude distortion of the power amplifier.

The phase shifting correcting channel is the phase distortion correcting means for outputting correction data for correcting the phase distortion of the power amplifier based on envelope signals of high frequency input signals supplied to the power amplifier to control the phase shifting processing of the power amplifier responsive to the correction data to correct the phase distortion of the power amplifier.

The channel for adaptive compensation of the amplitude distortion is the adaptive amplitude distortion compensation means and finds the amplitude difference between the envelope signal of an input signal supplied to the power amplifier and the envelope signal of an output signal of the power amplifier to output adaptive amplitude distortion correction data against temperature variations of the power amplifier based on results corresponding to integration and cumulation of the amplitude differences to effect adaptive compensation of the amplitude distortion of the power amplifier.

The amplitude distortion correcting channel includes an envelope detection unit (DET$_1$) 1, fed with a portion of a high frequency signal S1, undergoing variations in an envelope S2, and adapted for detecting the envelope S2, and an A/D converter 3 for digitizing the envelope S2 after passage thereof through a first selector (SEL$_1$) 2, and for outputting a digital signal S21. The amplitude distortion correcting channel also includes a first memory (M$_1$) 6 which is fed as an address with a signal S3 corresponding to this digital signal S21 passed through a second selector (SEL$_2$) 4 and held by a second latch (LCH$_2$) 5 and which outputs amplitude correction data S7, corresponding to this address, pre-stored for amplitude correction, and a second adder (ADD$_2$) 7 for summing an output S7 of the first memory 6 to a digital signal S44 as later explained. The amplitude distortion correcting channel also includes a first D/A converter (D/A$_1$) 8 for analogizing summed results S9 of the second adder 7, and a first low-pass filter (LPF$_1$) 9 for removing the digital noise contained in the analog signal from the first D/A converter 8.

The phase distortion correction channel includes a second memory (M$_2$) 10 for outputting phase correction data S4 corresponding to the digital signal S3, which is data pre-stored for phase correction, a second D/A converter (D/A$_2$) 11 for analogizing an output S9 of the second memory 10 and a second low-pass filter (LPF$_2$) 12 for removing the digital noise contained in the analog signal from the second D/A converter 11.

The adaptive compensation channel for the amplitude distortion includes a random access memory (RAM$_1$) 17 for reading out data stored in association with an address which is the aforementioned digital signal S3, and for outputting the read-out signal, or writing a signal S41 as later explained, and a second envelope detection unit (DET$_2$) 13 for detecting an envelope S31 of an output S30 of a power amplifier (PA) 23, the distortion of which is to be compensated. The adaptive compensation channel for the amplitude distortion includes a subtractor (SUB) 15 for digitally subtracting, from the digital signal S3, a signal S24 obtained on passing the envelope S31 through the first selector 2, digitizing the envelope by the A/D converter 3, passing the digitized envelope through a second selector 4 and on latching the result in a third latch (LCH$_3$) 14, and a first adder (ADD$_1$) 16 for digitally summing the digital signal S40 to a digital signal S43 as later explained to output the result as a signal S41, and the first latch circuit (LCH$_1$) to latch the output signal S42 of the random access memory 17 as a S43. The adaptive compensation channel for the amplitude distortion includes a third memory (M$_3$) fed with the latched signal S43 as address and adapted for outputting adaptive correction data S44, corresponding to this address, pre-stored for adaptive correction.

The first adder 16, random access memory 17 and the first latch circuit 18 make up cumulation means, while the third memory 19 is adaptive correction data outputting means.

The A/D converter, used for this channel, is used for digitizing the envelopes of the input signal S1 and the output signals S30 of the power amplifier 23, and uses a selector and a latch for selecting and holding these signals.

The channel for passage of the high frequency signals includes a delay device (DL) 20, fed with the high frequency signal S1 and adapted for delaying the time of passage to give a signal S50, and a phase shifter (PH) 21, fed with an output 50 of the delay device 20 and having an output S6 of the second low-pass filter 13 coupled to its control terminal. The phase shifter 21 is able to change the passage phase of the input signal by the signal applied to the control terminal. The channel for passage of the high frequency signals also includes a gain changing unit (AM) 22, fed with an output 51 of the phase shifter 21 and having an output S11 of the first low-pass filter 9 coupled to its control terminal. The phase shifter 21 is able to change the passage gain by the signal applied to the control terminal. An output S52 of the gain changing unit 22 is input to the power amplifier 23 the distortion of which is to be corrected.

This distortion compensation apparatus includes, in addition to the aforementioned respective channels, a clock generator (CLK) 24 for generating clock signals MRW for switching the read/write timing for the random access memory 17 and a clock generator CLK 24 for generating clock signals LC for permitting the latch circuits (LCH 1 to 3) to perform latching operations.

The operation of the distortion compensation apparatus of the present invention is hereinafter explained. Referring to FIG. 3, high frequency input signals S1 of quadrature phase modulated signals, such as band-limited π/4 shift QPSK (quadrature phase shift keying) signals or 0° QPSK signals, as used in a portable telephone set, are fed to an input terminal Tin of the distortion compensation apparatus. This high frequency input signal S1 contains an envelope component modulating the high frequency carrier with a base-band signal component and which is gradually fluctuated as time elapses. The high frequency input signal S1, fed to the input terminal Tin, is divided into two portions which are separately input to an amplitude distortion correcting channel and to a fourth channel.

First, the amplitude distortion correcting channel is explained. The high frequency input signal S1, input to the amplitude distortion correcting channel, has its envelope signal S2 detected by an envelope detection circuit 1. The envelope signal S2, detected by the envelope detection circuit 1, is selected by a first selector 2 to prove a select output signal selector output signal S20 which is converted by the A/D converter 3 into the digital signal S21. This digital signal S21 is further selected by a second selector 4 to prove a selector output signal S23 which then is held by a second latch 5 so as to be output as signal S3.

This signal S3 is input as an address to the first memory 6, which has stored therein correction data for amplitude correction from the outset and which outputs to the adder 7 the amplitude correction data S7 associated with the aforementioned signal S3 as an address. Meanwhile, the signal S3 is also furnished to the second memory 10 of the phase distortion correction channel, to a subtractor 15 of the adaptive amplitude distortion compensating channel and to a random access memory 17, in a manner which will be explained subsequently.

The adder 7 sums the amplitude correction data S7 to adaptive compensation data S44 as later explained to send the resulting sum output S9 to the first D/A converter 8. The first D/A converter 8 converts the sum output S9, that is the adaptive compensation data S44, summed to the amplitude correction data S7, into an analog signal S10, which then is sent to the first low-pass filter 9. The first low-pass filter 9 sends a filter output signal S11, corresponding to the analog signal S10 freed of the digital noise, to a control terminal of the gain changing unit 22 making up the high frequency signal passage channel. The gain changing unit 22 controls the passage gain (amplitude) with the signal S11 sent to the control terminal as a control signal.

The amplitude correction data, stored in the first memory 6, is now explained. If the envelope voltage of the input signal S1 is Vi(t), an envelope voltage of an output S52 of the gain changing unit 22 is Vpd(t) and the voltage of the control signal S11 applied to the control terminal of the gain changing unit 22 is Vc(t), the voltage stored in the first memory 6 is this Vc(t).

If now the gain G (vc) of the gain changing unit 22 is represented as $$G(vc)=1+a \cdot Vc(t) \quad (1)$$

where a is a conversion coefficient, $$Vpd(t)=Vi(t) \cdot G(vc) \quad (2)$$

so that, by substituting the equation (2) into the equation (1), there is obtained an equation $$Vpd(t)=Vi(t) \cdot (1+a \cdot Vc(t))$$

from which $$Vc(t)=(1/a) \cdot (Vpd(t)/Vi(t)-1) \quad (3)$$

is obtained.

Figure 5:
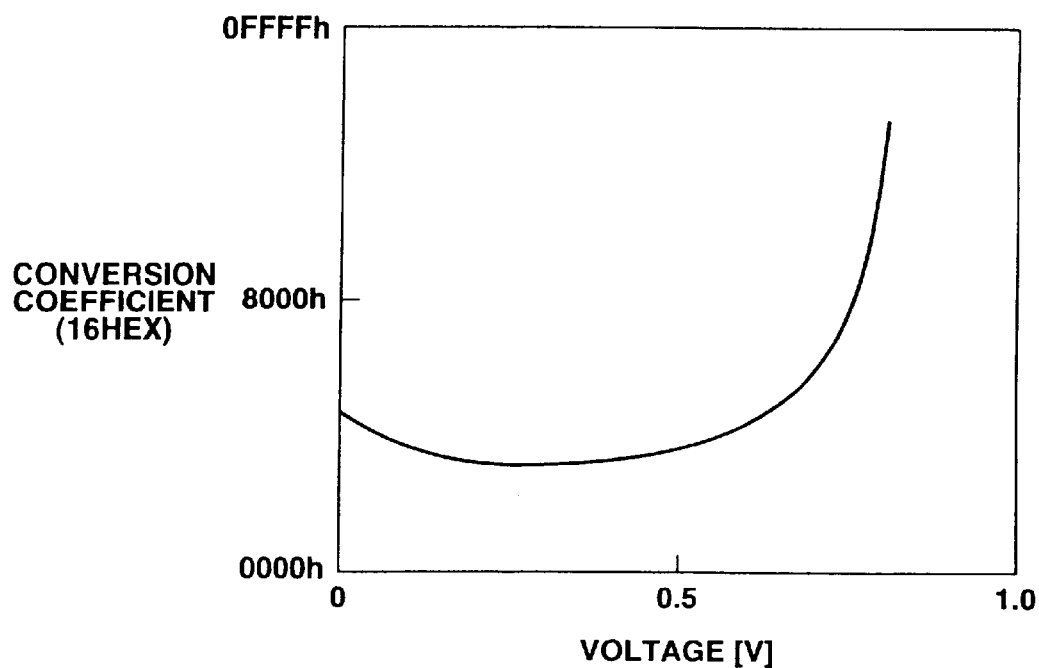
FIG. 5 shows an amplitude compensation table at room temperature.

The envelope voltage Vpd(t) can be found by measuring input output characteristics, shown in FIG. 5, of the power amplifier 23, the distortion of which is to be corrected. Therefore, it suffices to store the result of calculations of the aforementioned equation (3), using the envelope voltage Vpd(t), in the first memory 6 at the outset.

The operation of the phase distortion correction channel is now explained. The operation of this phase distortion correction channel is similar to that described above. That is, the signal S3, output after being held by the second latch 5 accesses the second memory 10 of the same configuration as the first memory 6 in the adaptive compensation correction channel to cause the outputting of the phase correction data S4 previously stored in the second memory 10. This data second selector 4 is converted by the second D/A converter 11 into an analog S5 which then is passed through the second low-pass filter 12 to prove a signal S6. This signal S6 is input to a control terminal of the phase shifter 21 making up the aforementioned high frequency signal passage channel to control the passage phase to compensate the phase distortion of the power amplifier 23 desired to be phase-compensated.

In the absence of temperature fluctuations, or the like changes, the target power amplifier 23 is compensated for distortion by the operation of the amplitude distortion correction channel and the phase distortion correction channel. However, should changes in e.g., temperature occur, compensation by the two channels becomes insufficient, such that a channel is needed which performs adaptive compensation of the amplitude distortion for coping with these fluctuations.

The operation of the channel for adaptive compensation of the amplitude distortion, that is the operation for adaptive compensation, is hereinafter explained. An envelope signal S31 of an output S30 of the power amplifier 23, the distortion of which is to be compensated, is detected by the second envelope detector 13, and is selected by the first selector 2 and digitized by the A/D converter 3 to give the digital signal S21. This digital signal S21 is selected by a fourth selector 4 and held by a third latch 14 so as to be sent as a signal S24 to a subtractor 15. The subtractor digitally subtracts the signal S24 from the digital signal S3 to output the subtracted result as a digital signal S40. If distortion persists in the output of the power amplifier 23 desired to be compensated, only the distortion component appears in the subtracted result S40 as a result of the subtraction. The subtracted result S40 is summed to data written in the random access memory 17 and which has the signal S3 as an address so as to be again written in the random access memory 17. Since the data in the random access memory 17 are switched from readout to writing or vice versa so that it is once read out and saved in the first latch circuit 18. Should the signal S3 providing an address repeat the same value, the data in the random access memory 17 corresponding to the address is summed repeatedly and rewritten repeatedly. The data in the random access memory 17 prove an address of the next following third memory 19 to cause the data stored in this third memory 19 to be output. The data S44 in the third memory is summed by the second addition unit 7 in the amplitude distortion correction circuit to the amplitude correction data of the first memory 6. The resulting sum is input to the power amplifier 23 desired to be compensated to contribute to correction of the amplitude distortion. So, should the effect proper to adaptive compensation be manifested, the subtracted result S40 approaches to zero, with the data in the random access memory 17 converging to a certain value. This converged value is such as to reduce the distortion of the power amplifier 23 desired to be compensated.

The data stored in the third memory 19 is now explained. In case the amplitude distortion is to be compensated by exploiting the characteristics of the gain changing unit 22, it is necessary to effect data conversion as indicated in the equation (3) above. Conversely, since the data stored in the first memory 6 has already been converted in this manner, the data to be summed or subtracted in the second addition unit 7 effects bit addition or subtraction with the least significant bit as a unit, in the first memory 6, so that it can handle only the added or subtracted values, and hence it is unnecessary to take the conversion of the equation (3) into account. That is, it is only sufficient if the linear conversion of decrementing or incrementing the value of the first memory 6 for positive or negative values of the signal S40 is performed for the third memory 19.

Since the data written in the random access memory 17 is sequentially summed to or subtracted from the previously stored value, the result of consecutive cumulation in the positive or negative direction determines the address of the third memory 19. The result is that the slightest value of the distortion component that has occurred is cumulated by the integrating action and proves a large value which may be corrected readily.

In general, should the temperature be fluctuated from −30° C. to +80° C., the gain variation is on the order of 5 dB. However, the phase change is on the order of a few degrees at most. Therefore, in the distortion compensation apparatus, shown in FIG. 3, adaptive compensation of the phase displacement is not performed. Meanwhile, a specified embodiment of the adaptive compensation of the phase displacement will be explained subsequently.

The switching operation for the A/D converter 3, used in common for the routine compensation and adaptive compensation in the distortion compensation apparatus shown in FIG. 3, is hereinafter explained. Specifically, such an operation is repeated in which the signal S25 causes selector switching, such that the case of digitizing the envelope of the input signal S1 and latching the digitized envelope as a signal S3 and the case of digitizing the envelope of the output S30 of the power amplifier 23 and latching the digitized envelope as the signal S24 are presented alternately. This allows to use a sole A/D converter for digitizing an input signal and for digitizing an output signal, thus reducing the size of the distortion compensation apparatus and achieving the saving in power consumption.

Figure 4:
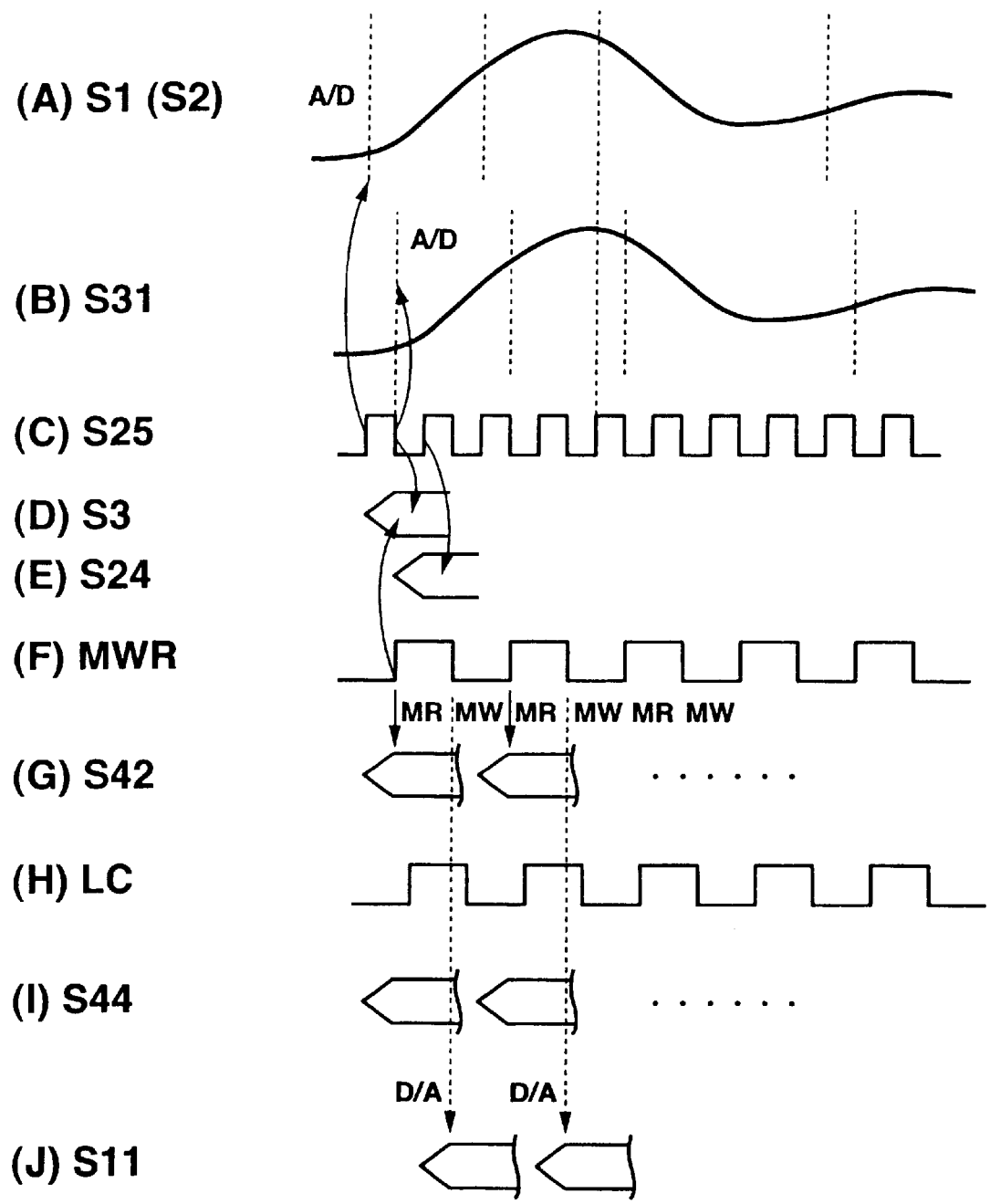
FIGS. 4(A)–4(J) are timing charts of the distortion compensation apparatus shown in FIG. 3.

The overall timing operation is now explained using the timing diagram shown in FIG. 4 the envelope signal S2 of the input signal S1 and the envelope signal S31 of the power amplifier 23 are switched in accordance with the timing of the signal S25 generated by the clock generator 24, at the same time as the digitized signals S22 (S24) and selector output signal S23 (S3) are latched. The random access memory 17 is read out with the rising edge of the clock MRW, obtained on frequency dividing the signal S25 in two, to produce a read-out signal S42, which is latched with the rising edge of the clocks LC. An address of the random access memory 17 at this time is a signal S3 obtained on digitizing the envelope S2 of the input signal S1. The clocks LC are obtained y the clock generator 24 delaying the clocks MRW. Using the clocks LC, the readout signal S42 is latched by the first latch 18, at the same time as the third memory 19 starts to be accessed to read out the signal S44. This signal S44 is summed by the second addition unit 7 to the signal S7 to form a sum signal S9 and subsequently rendered into an analog signal S10 at the first D/A converter 8 in timed relation to the decay of the clocks MRW and into an output signal S11 through the low-pass filter 9 the above operations are repeated within each period of the clocks MRW.

Figure 6:
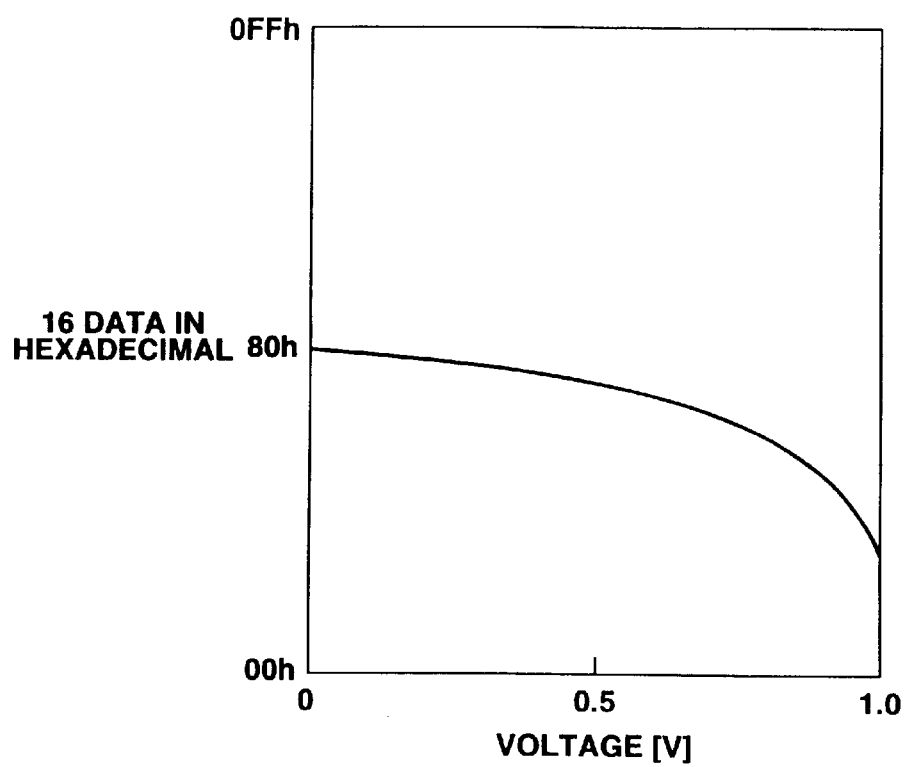
FIG. 6 shows a phase compensation table at room temperature.
Figure 7:
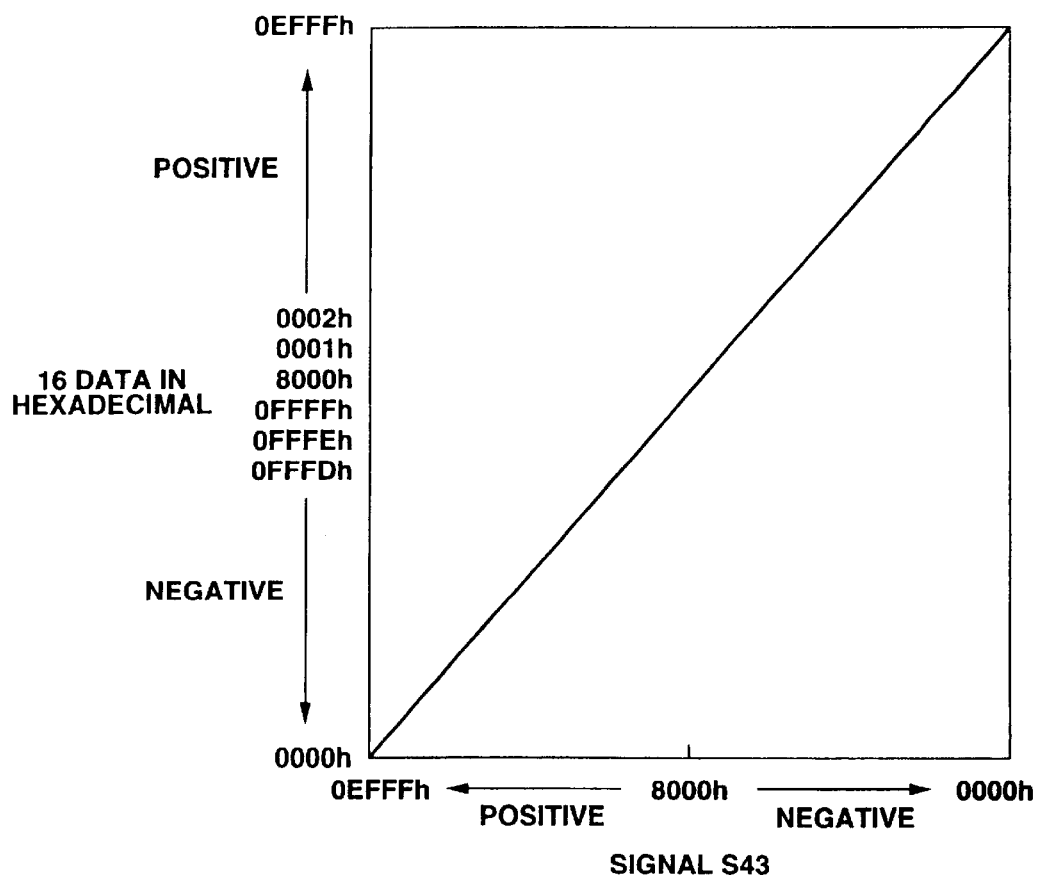
FIG. 7 shows an adaptive compensation table.

Next, data stored in the first memory 6, second memory 10 and in the third memory 19 are indicated in the drawings. FIG. 5 shows typical data stored in the first memory 6. The abscissa and the ordinate indicate the voltage of an envelope signal S1 and the amplitude correction data converted in accordance with the equation (3). FIG. 6 shows data stored in the second memory 10 and which allows for phase compensation. FIG. 7 shows data stored in the third memory 19 and which has been linearly converted with respect to the positive and negative signs.

Figure 8:
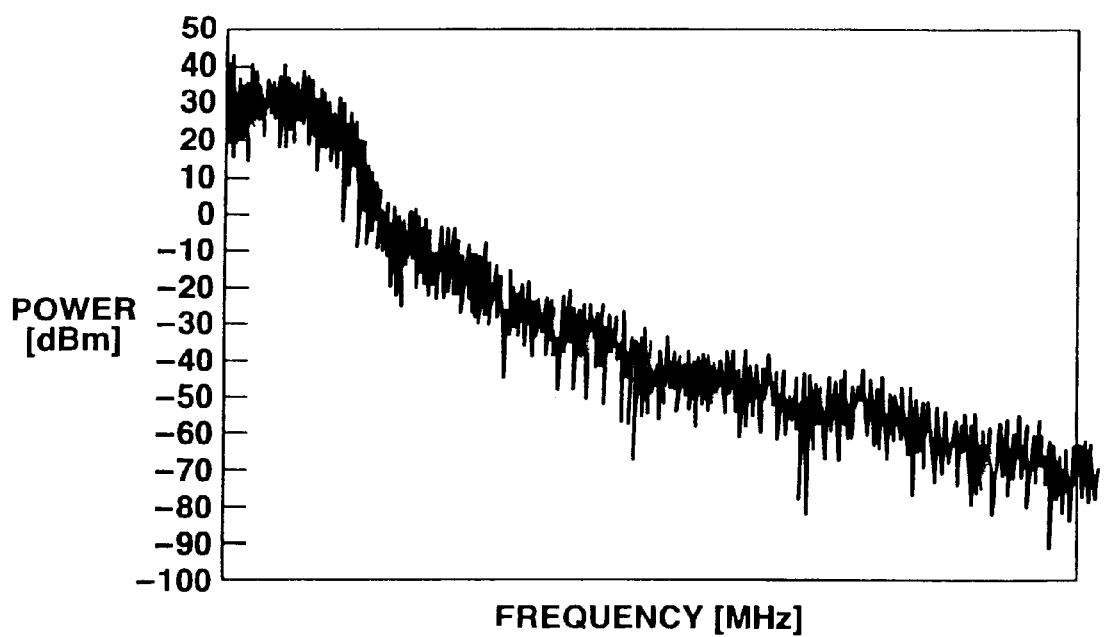
FIG. 8 is a graph showing a distortion spectrum in a power amplifier.
Figure 9:
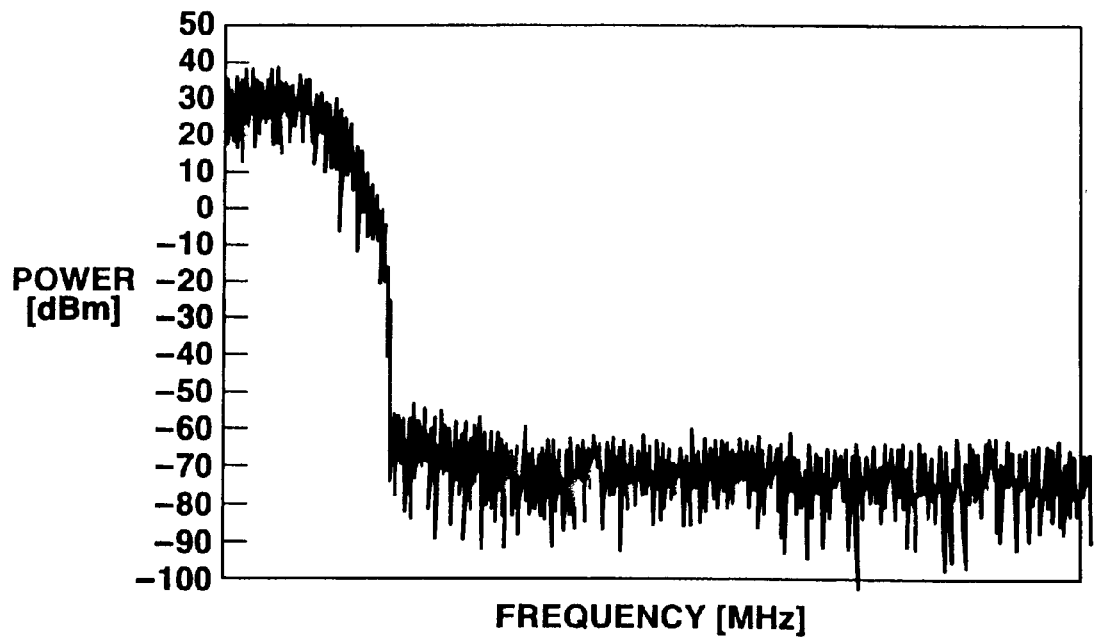
FIG. 9 is a graph showing typical distortion compensation at room temperature.

The results of executing the invention are now shown. FIGS. 8 and 9 indicate typical distortion compensation for 25° C. (room temperature). Specifically, FIGS. 8 and 9 show a spectrum containing distortion generated by the power amplifier 23 and a spectrum following distortion compensation by the second memory 10, respectively.

Figure 10:
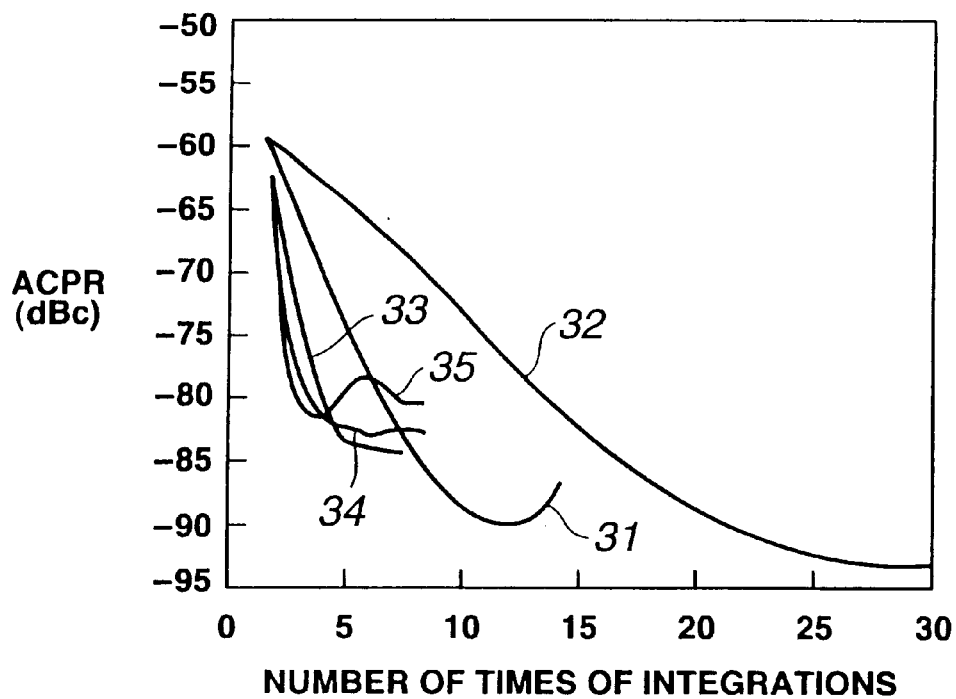
FIG. 10 is a graph showing the results of adaptive compensation at −30° C.
Figure 11:
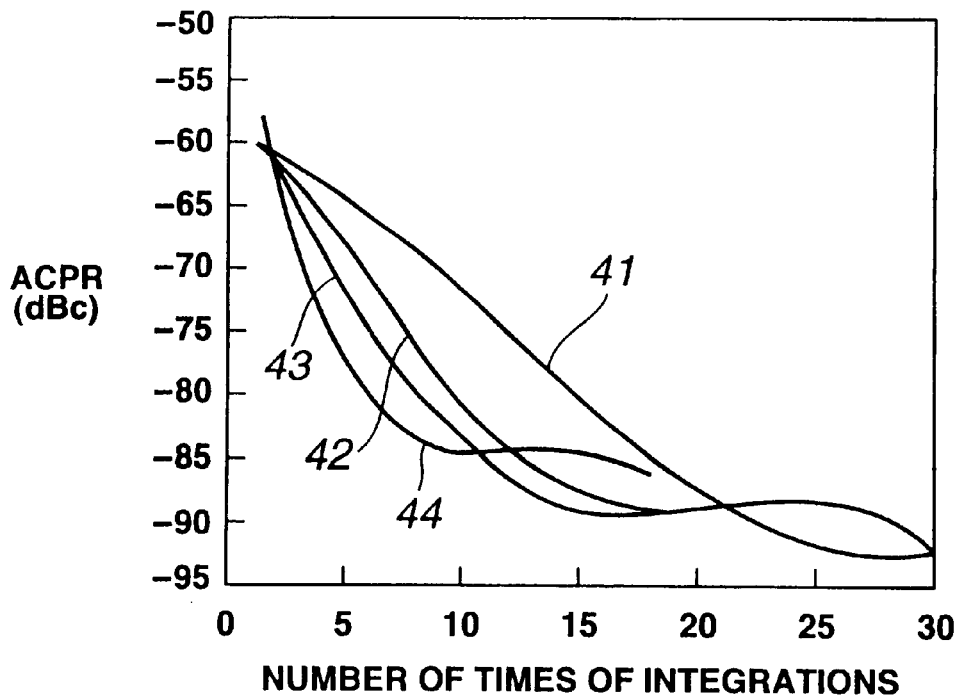
FIG. 11 is a graph showing the results of adaptive compensation at +80° C.
Figure 12:
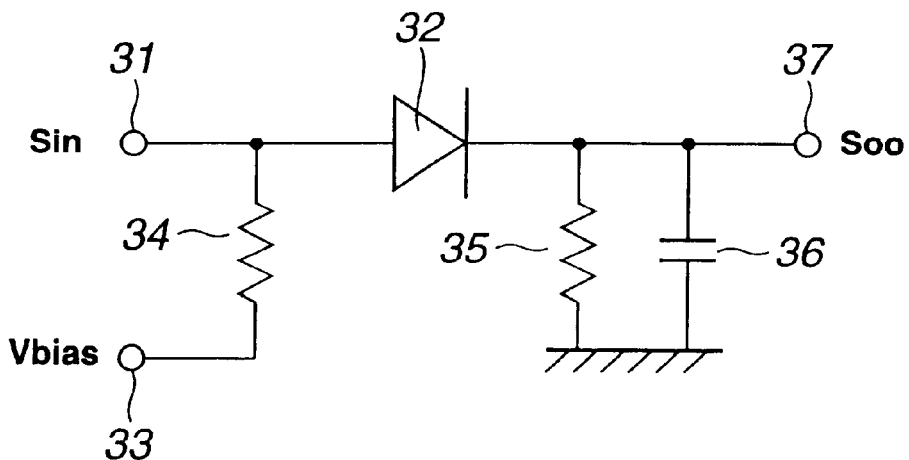
FIG. 12 is a circuit diagram showing a specified structure of an envelope detector used in the distortion compensation apparatus shown in FIG. 3.

FIGS. 10 and 11 show the results of adaptive compensation. Specifically, FIG. 10 shows a case for −30° and indicates how the distortion component on the ordinate (ACPR, dBc) are changed with respect to the number of times of cumulation in case a parameter (gain Cef) is changed within a range of 0.25 to 1.0. In the drawing, characteristics 31 to 35 are obtained for the above parameter of 0.25, 0.5, 0.75, 0.9 and 1.0, respectively. The gain Cef indicates the tilt of a straight line in FIG. 7. The larger the value Cef, the larger becomes the tilt. It may be seen that the distortion power is decreased with an increasing number of integration. This is due to the least resolution that can be compensated depends on the coefficient Cef, and indicates that the resolution becomes coarse for a larger value of Cef, resulting in distortion persistence.

FIG. 11 shows the manner of adaptive compensation for +80°. The gain Cef, as the parameter, is varied within a range of 0.5 to 1.25. In FIG. 1, characteristics 41 to 44 are obtained for the above parameter (gain Cef) of 0.5, 0.75, 1.0 and 1.25, respectively. Comparison with FIG. 10 reveals that, since the gain of the power amplifier 23 is lowered for higher temperature, the loop gain of the feedback loop making up the adaptive amplitude distortion compensation is lowered thus increasing the number of times of integration required for deceasing the distortion power.

Figure 13:
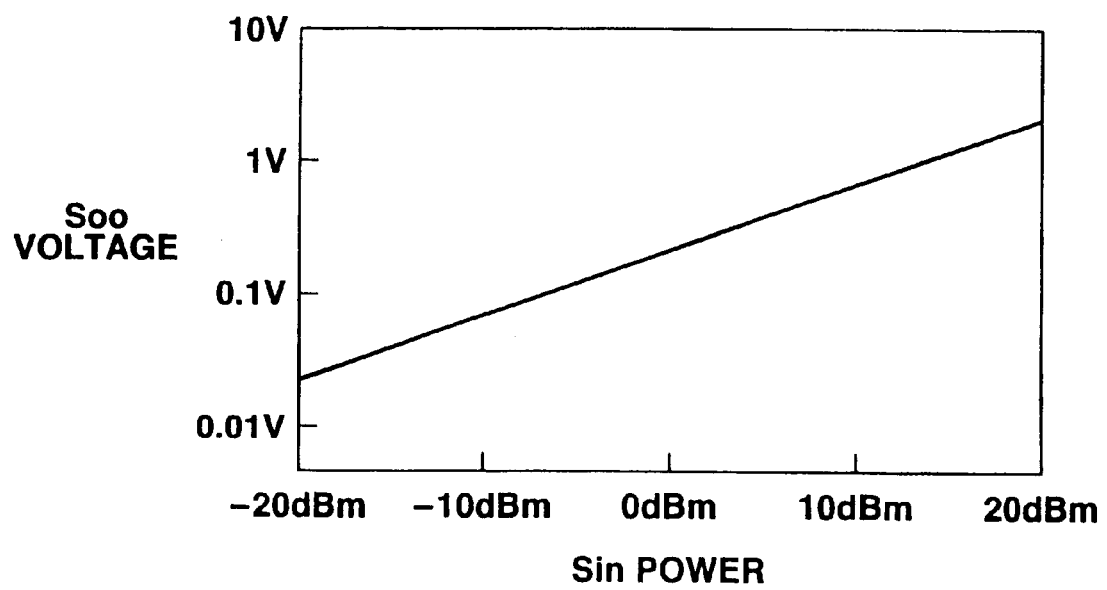
FIG. 13 is a graph showing characteristics of the envelope detector shown in FIG. 12.

The detailed structure of the respective portions making up the distortion compensation apparatus shown in FIG. 3 is now explained. First, in the envelope detection circuit 1, an input high frequency signal Sin (S1) is sent via input terminal 31 to an anode terminal of a diode 32. An output signal Soo (S2) is derived from a cathode terminal connected to an output terminal 37. A parallel connection of a resistor 35 and a capacitor 36 is connected across the cathode terminal of the diode 32 and the ground. If high frequency signal Sin (S1) is fed to the input terminal 31, only the output signal Soo (S2) of the envelope component is presented at the output terminal 37. For improving non-linearity of a small amplitude signal portion, the diode 32 is fed with a bias-voltage Vbias from a bias terminal 33 through a bias resistor 34. FIG. 13 shows characteristics of the envelope voltage output signal Soo, obtained in the illustrative structure of FIG. 10, relative to the high frequency signal power applied as the input signal Sin.

Figure 14:
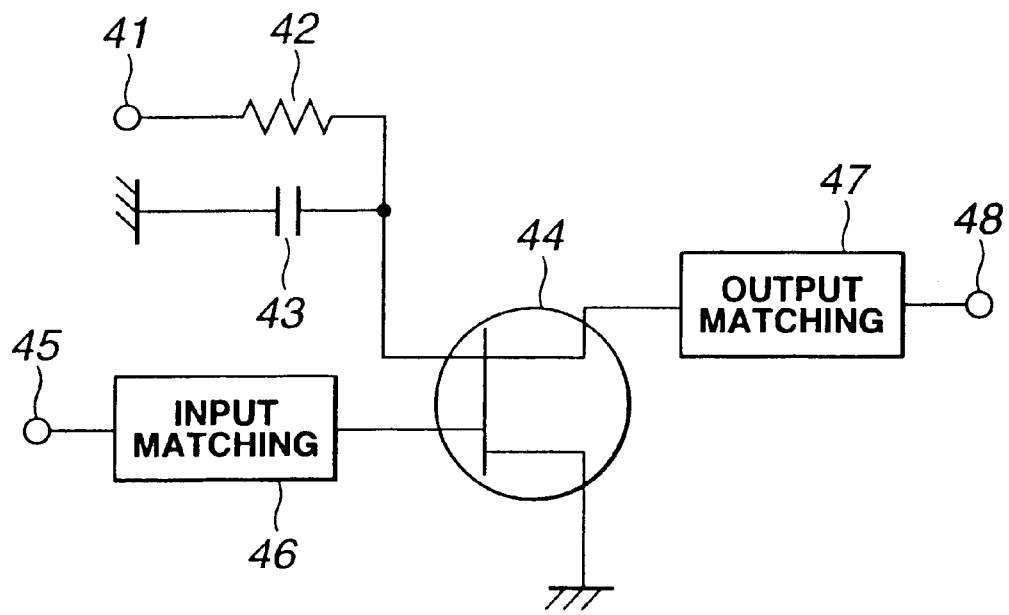
FIG. 14 is a circuit diagram showing a structure of a specified structure of a gain changing unit used in the distortion compensation apparatus shown in FIG. 3.

Referring to FIG. 14, a specified embodiment of a circuit usable as the gain changing unit 22 is explained. In this embodiment, a dual gate FET 44 is used, with the circuit structure being of a source grounded type. The high frequency power to be controlled is input to the input terminal 45 to traverse an input matching circuit 46 so as to be input to the first gate GI of the dual gate FET 44. To the drain D of the dual gate FET 44 is connected an output matching circuit 47 so that a controlled high frequency signal is output at an output terminal 48. A control voltage Vc is applied via a control terminal 41 to the second gate G2 of the dual gate FET 44 connected to a resistor 42 and a capacitor 43. The mutual conductance of the dual gate FET 44, which depends on the voltage applied to te second gate G2, is used to control the gain.

Figure 15:
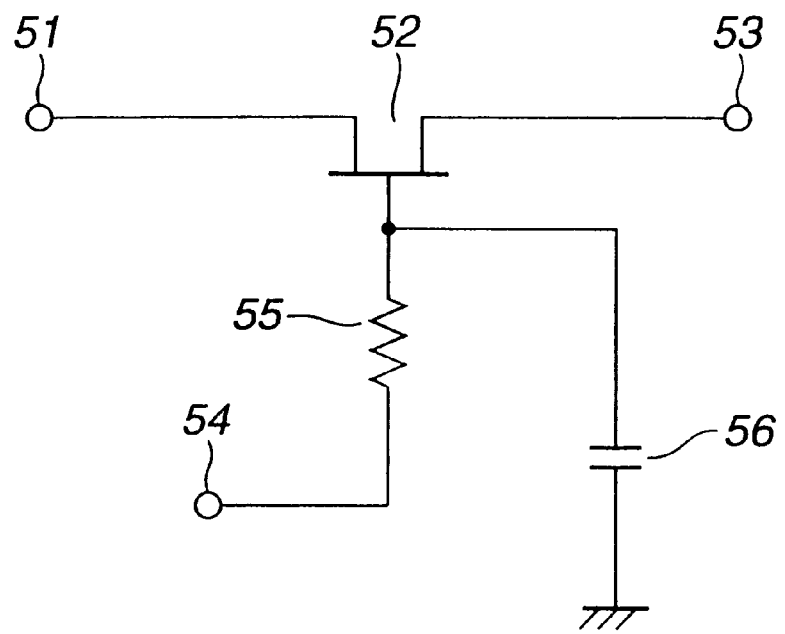
FIG. 15 is a circuit diagram showing a structure of another specified structure of a gain changing unit used in the distortion compensation apparatus shown in FIG. 3.

FIG. 15 shows another specified embodiment of the gain changing unit 22 employing a gate grounded FET 52. In this figure, terminals 51, 53 represent a source and a drain of the FET 52 and a path for high frequency signals. A control voltage is applied from a terminal 54 to adjust the passage loss. A capacitor 56 is connected across the gate and the ground.

The gain changing unit 22 is desirably so designed that the passage phase is not fluctuated with gain fluctuations. The circuits of FIGS. 14 and 15 both satisfy this requirement.

Figure 16:
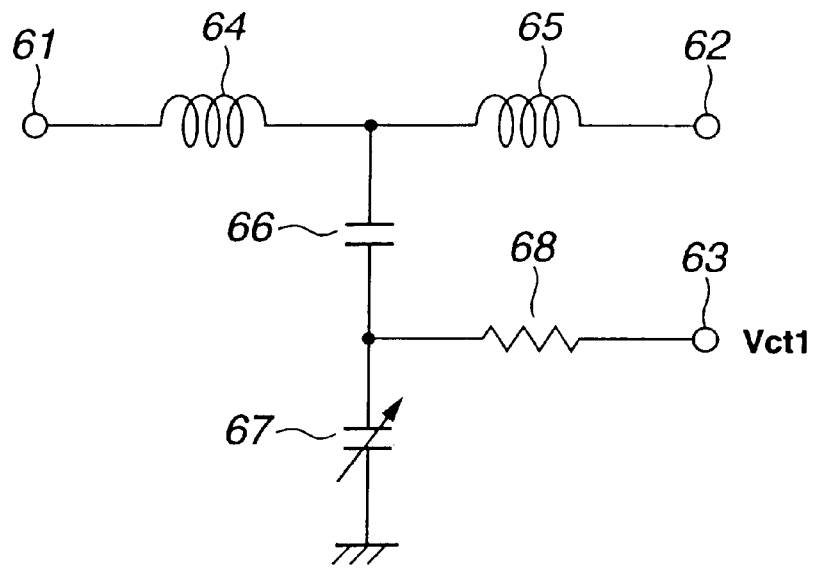
FIG. 16 is a circuit diagram showing a structure of a specified phase shifter used in the distortion compensation apparatus shown in FIG. 3.

FIG. 16 shows a specified embodiment of the phase shifter 21 in which terminals 61, 62 are input/output terminals across which coils 64, 65 are connected in series. A capacitor 66 and a variable capacitance 67, such as a VARICAP diode, are connected in series to a junction of the two coils 64, 64 and connected to the ground, and a control terminal 63 is provided through a resistor 68 to a junction between the capacitor 66 and the variable capacitance 67. The high-frequency signal traversing the terminals 61, 62 can be shifted in phase by a voltage Vct1 applied to the control terminal 63.

Figure 17:
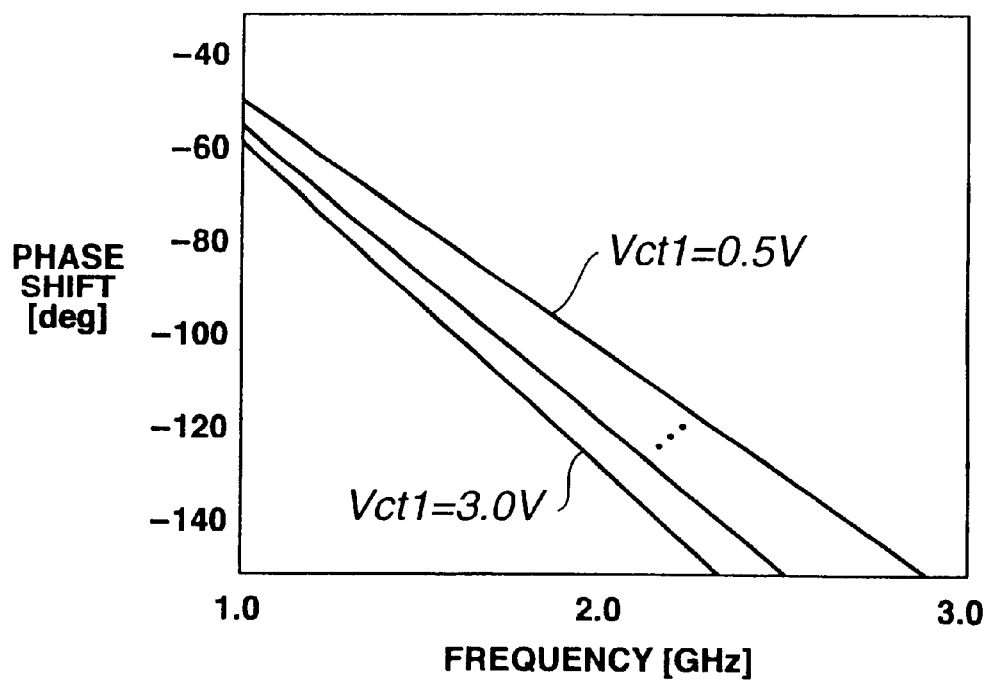
FIG. 17 is a graph showing characteristics of the phase shifter shown in FIG. 16.

FIG. 17 shows typical characteristics of the phase shifter 21 in case the capacitor 66, resistor 68 and the coils 64, 65 are set to 2.5 pF, 1 kΩ, 5 nH and 5 nH, respectively. The phase shift of 10° to 40° takes place generally in a range from 0.5 V to 3.0 V, depending on the frequency.

In the distortion compensation apparatus, shown in FIG. 3, adaptive compensation data required for pre-distortion can be realized extremely readily without requiring orthogonal demodulation because the distortion components of the power amplifier 23 are enabled by using the method of envelope detection. Since the distortion component is detected by integration of the output and the input difference to effect distortion compensation, the slightest distortion component can be advantageously compensated. Moreover, since the A/D converter is used in a switching fashion between rotine compensation and adaptive compensation, only one A/D converter suffices, so that small size and low power consumption may advantageously be achieved.

In the distortion compensation apparatus, shown in FIG. 3, fluctuations in phase shift accompanying temperature fluctuations are comprised within a few degrees, and hence no adaptive compensation of the phase shift is made. However, should adaptive compensation be made to extremely high accuracy, the adaptive phase compensation is desirably performed. A specified embodiment of the distortion compensation apparatus for adaptive phase distortion compensation is now explained with reference to FIG. 18. It is noted that the blocks of the same configuration as that of FIG. 3 are indicated by the same reference numerals and the detailed description is omitted for simplicity. The selector (SEL) and the latch (LCH) are omitted for convenience in description.

The distortion compensation apparatus includes adaptive phase distortion compensation means which outputs adaptive correction data for the phase distortion against temperature changes of the power amplifier, based on the phase difference between the input signal supplied to the power amplifier and the output signals of the power amplifier, and effects adaptive compensation of phase distortion of the power amplifier using the adaptive correction data.

Figure 18:
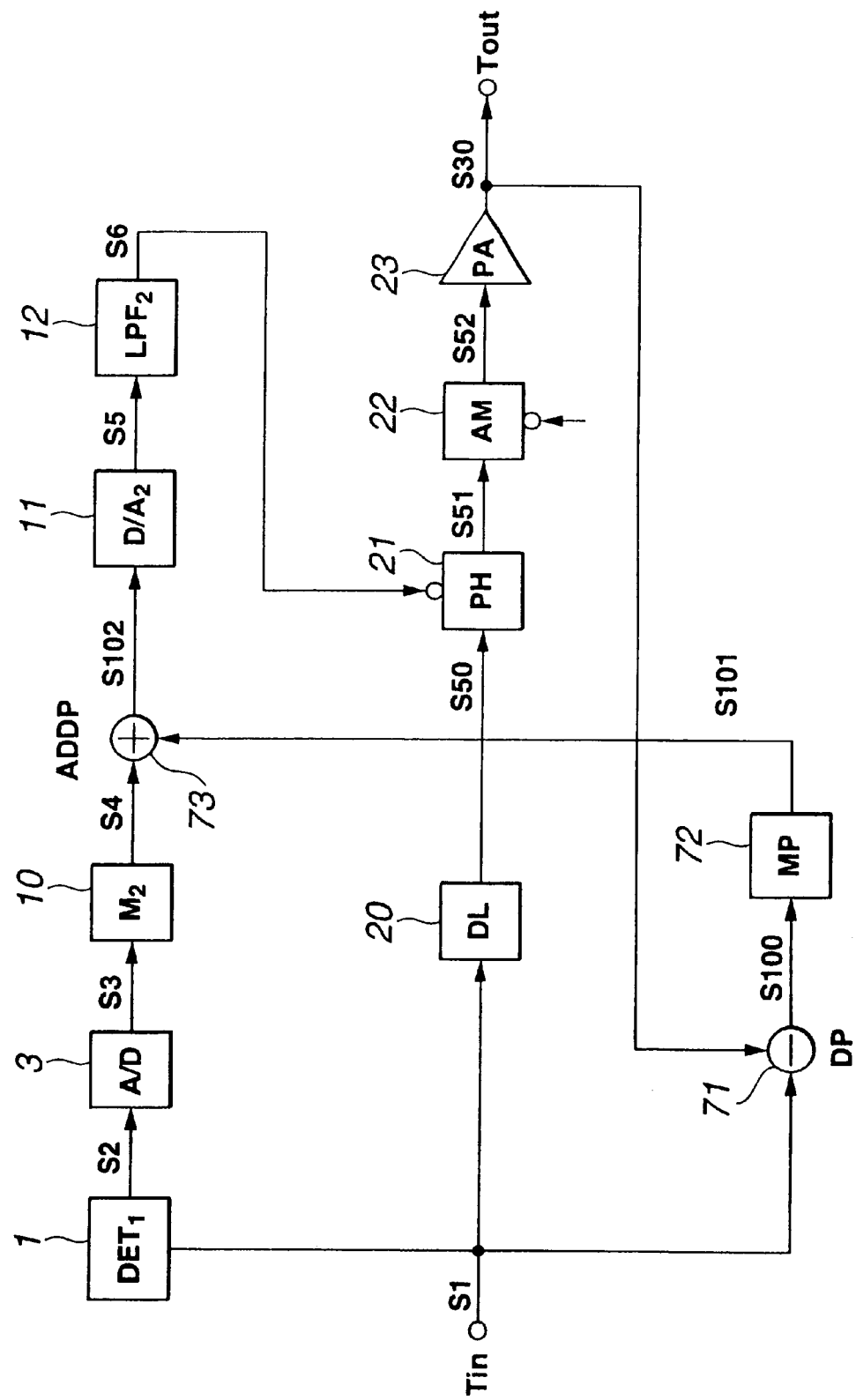
FIG. 18 is a block diagram showing the structure of a distortion compensation apparatus for adaptive compensation for phase distortion.

In particular, a distortion compensation apparatus, shown in FIG. 18, includes a phase difference detector (DP) 71, fed with an input signal S1 and an output signal S30 of the power amplifier. 23 to output the phase difference therebetween as a voltage S100, a memory (MP) 72 for outputting, as signal S101, data having an output of the phase difference detector 71 as an address, and an adder 73 fed with an output of the memory 72 and summing the output of the second memory 10 to the output of the memory 72. A sum output of the adder 73 is routed to the second D/A converter 11.

The operation is hereinafter explained. If the data of the second memory 10, as a table for phase compensation, is proper, no output appears in the phase difference detector 71 so that no operation occurs. If the data is not proper, a voltage S100 dependent on the phase different of the input/output signal of the power amplifier 23 is generated. In the memory 72, data similar to that in the random access memory 17 is stored and data conversion dependent on the signal S100 is executed to produce a signal S101. This signal S101 is summed to the output S4 of the phase compensation table (second memory 10) to contribute to the control of the phase shifter 21.

Figure 19:
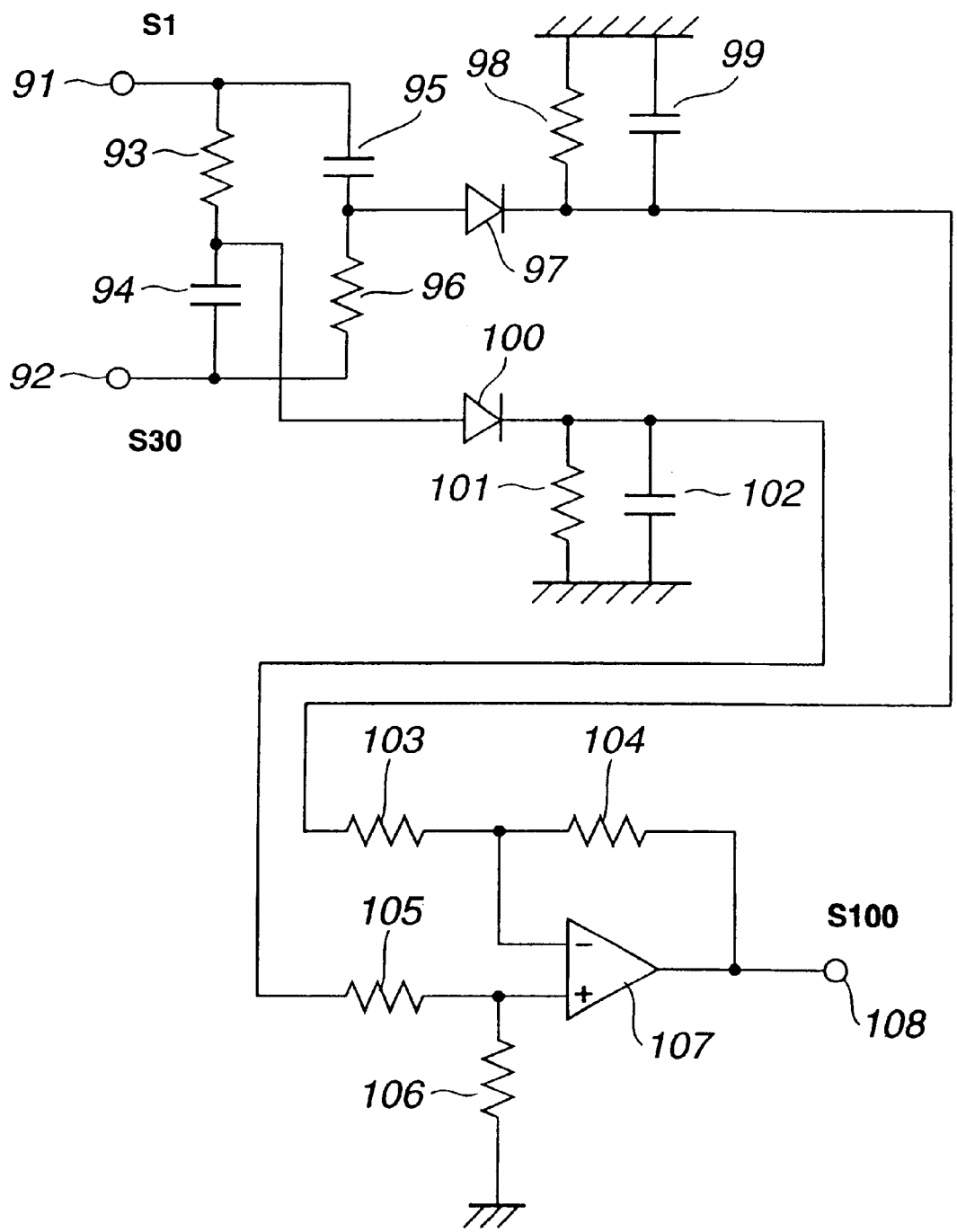
FIG. 19 is a circuit diagram showing a structure of a specified phase difference detector used in the distortion compensation apparatus shown in FIG. 18.

FIG. 19 shows a specified embodiment of the phase difference detector 71. A series connection of a resistor 93 and a capacitor 94 and another series connection of a capacitor 95 and a resistor 96 are connected in parallel to make up a bridge. If two signals (S1, S30), the phase difference of which is to be measured, are input to two opposite input terminals 91, 92 of the bridge, there is produced a voltage corresponding to the phase difference across the other two opposite terminals of the bridge. To these terminals are connected two square detection circuits, made up of diodes 97, 100, resistors 98, 101 and capacitors 99, 102, with the outputs of these square detection circuits being fed to a subtractor. This subtractor is comprised of an operational amplifier 107, an inverting terminal (−) of which is fed via a resistor 103 with an output of the first square detection circuit made up of the diode 97, resistor 98 and the capacitor 99, and a positive terminal (+) of which is fed via a resistor 105 with an output of the second square detection circuit made up of the diode 100, resistor 101 and the capacitor 102. A resistor 104 is connected across the inverting terminal (−) of the operational amplifier 107, whilst a resistor 106 is connected between the positive terminal (+) and the ground.

If an output of the first square detection circuit is Vi1, an output of the second square detection circuit is Vi2, the value of the resistor 103 is R1, the value of the resistor 104 is R2, the value of the resistor 105 is R3, and the value of the resistor 106 is R4, an output S100 appearing at an output terminal 108 is $$S100=(R4/R3)\cdot Vi2-(R2/R1)\cdot Vi1 \quad (4).$$

If R1=R2=R3=R4, the above equation (4) becomes the following equation (5):

$$V0=Vi2-Vi1 \quad (5).$$

A specified embodiment of a distortion compensation apparatus for executing adaptive phase displacement compensation using FIGS. 18 and 19 has now ben explained. By appending the distortion compensation apparatus for executing adaptive phase displacement compensation to the distortion compensation apparatus shown in FIG. 3, not only the amplitude distortion may be adaptively compensted with fluctuations in temperature, but also the phase distortion may be adaptive compensated, thus achieving adaptive compensation to extremely high accuracy.

What is claimed is:

1. A distortion compensation apparatus for compensating distortion components generated in a device, comprising:

adaptive amplitude distortion compensation means for finding an amplitude difference between an envelope signal of an input signal supplied to said device and an envelope signal of an output signal from said device, for outputting adaptive correction data of amplitude distortion against temperature fluctuations in said device based on cumulative and integrated results of said amplitude difference and for adaptively compensating the amplitude distortion of said device by using said adaptive correction data.

2. The distortion compensation apparatus according to claim 1 further comprising:

amplitude distortion correcting means for outputting correction data for correcting the amplitude distortion of said device based on the envelope signal of the input signal supplied to said device, and for controlling a gain changing process of said device responsive to said correction data to correct the amplitude distortion of said device.

3. The distortion compensation apparatus according to claim 2 wherein said adaptive amplitude distortion compensation means adds said adaptive correction data to said correction data used in said amplitude distortion correcting means to effect adaptive compensation of the amplitude distortion of said device.

4. The distortion compensation apparatus according to claim 1 wherein said adaptive amplitude distortion compensation means includes first envelope detection means for detecting an envelope component of an input signal supplied to said device; second envelope detection means for detecting the envelope component of an output signal from said device; subtraction means for finding an amplitude difference between the envelope component of said input signal as detected by said first envelope detection means and the envelope component of said output signal as detected by said second envelope detection means; cumulating means for integrating the amplitude difference as obtained by said subtraction means; and adaptive correction data output means for outputting adaptive correction data against temperature fluctuations in said device based on integrated results in said cumulating means.

5. The distortion compensation apparatus according to claim 1 further comprising:

adaptive phase distortion compensation means for outputting adaptive phase distortion correction data against temperature fluctuations of said device based on a phase difference between the input signal supplied to said device and an output signal from said device and for adaptively compensating a phase distortion of said device using said adaptive phase distortion correction data.

6. The distortion compensation apparatus according to claim 5 further comprising:

phase distortion correction means for outputting correction data for correcting the phase distortion of said device based on the envelope signal of the input signal supplied to said device and for controlling a phase shifting process of said device responsive to said correction data to correct the phase distortion of said device.

7. The distortion compensation apparatus according to claim 6 wherein said adaptive phase distortion compensation means adds said adaptive correction data to said correction data used in said phase distortion correcting means to adaptively compensate the phase distortion of said device.

8. The distortion compensation apparatus according to claim 5 wherein said adaptive phase distortion compensation means includes phase difference detection means for detecting the phase difference between the input signal supplied to said device and the output signal from said device and adaptive phase distortion correction data output means for outputting adaptive phase distortion correction data against temperature fluctuations of said device based on the phase difference as detected by said phase difference detection means.

9. The distortion compensation apparatus according to claim 1 wherein said device is power amplifying means and said input signal is a high frequency signal subject to envelope fluctuations.

10. A distortion compensation method for compensating distortion components generated in a device, comprising:

an adaptive amplitude distortion compensation step for finding an amplitude difference between an envelope signal of an input signal supplied to said device and an envelope signal of an output signal from said device; for outputting adaptive correction data of amplitude distortion against temperature fluctuations in said device based on cumulative and integrated results of said amplitude difference; and for adaptively compensating the amplitude distortion of said device using said adaptive correction data.

11. The distortion compensation method according to claim 10 further comprising:

an amplitude distortion correcting step for outputting correction data for correcting the amplitude distortion of said device based on the envelope signal of the input signal supplied to said device, and for controlling the gain changing process of said device responsive to said correction data to correct the amplitude distortion of said device.

12. The distortion compensation method according to claim 11 wherein said adaptive amplitude distortion compensation step adds said adaptive correction data to said correction data used in said amplitude distortion correcting step to effect adaptive compensation of the amplitude distortion of said device.

13. The distortion compensation method according to claim 10 further comprising:

an adaptive phase distortion compensation step for outputting adaptive phase distortion correction data against temperature fluctuations of said device based on a phase difference between the input signal supplied to said device and an output signal from said device and for adaptively compensating a phase distortion of said device using said adaptive correction data.

14. The distortion compensation method according to claim 13 further comprising:

a phase distortion correction step for outputting correction data for correcting the phase distortion of said device based on the envelope signal of the input signal supplied to said device and for controlling the phase shifting process of said device responsive to said correction data to correct the phase distortion of said device.

15. The distortion compensation method according to claim 14 wherein said adaptive phase distortion compensation step adds said adaptive correction data to said correction data used in said phase distortion correcting step to adaptively compensate the phase distortion of said device.

16. The distortion compensation method according to claim 10 wherein said device is power amplifying means and said input signal is a high frequency signal subjected to envelope fluctuations.

* * * * *